April 14, 1970 R. J. McNERNEY ET AL 3,506,772

ELECTRONIC DIODE KEYING CIRCUIT WITH VARIABLE SUSTAIN

Filed June 26, 1967 2 Sheets-Sheet 1

Inventors.
Roger J. McNerney
William V. Machanian
Robert D. Barry
By: Olson, Trexler, Wolters & Bushnell attys.

April 14, 1970 R. J. McNERNEY ET AL 3,506,772

ELECTRONIC DIODE KEYING CIRCUIT WITH VARIABLE SUSTAIN

Filed June 26, 1967 2 Sheets-Sheet 2

Inventors
Roger J. McNerney
William V. Machanian
Robert D. Barry
By: Olson, Trexler, Wolters & Bushnell Attys.

United States Patent Office 3,506,772
Patented Apr. 14, 1970

3,506,772

ELECTRONIC DIODE KEYING CIRCUIT WITH VARIABLE SUSTAIN

Roger J. McNerney, Tonawanda, and William V. Machanian and Robert D. Barry, North Tonawanda, N.Y., assignors to The Wurlitzer Company, Chicago, Ill., a corporation of Ohio Filed June 26, 1967, Ser. No. 648,613
Int. Cl. G10h *1/02*
U.S. Cl. 84—1.01 5 Claims

ABSTRACT OF THE DISCLOSURE

A two manual electronic organ in which the generators are continuously oscillating and are switched through diodes to utilization circuits, and wherein a plurality of key switches corresponding to different keys and bearing an octave or footage relation to one another are connected through respective diodes to the generator switching diodes, and wherein sustain is also controlled through diodes.

In the electronic organ art, is has long been known to use continuously operating or oscillating generators, and to switch the output of such generators selectively to utilization circuits through respective key switches. The signal at this point is at a relatively low level, and any noise introduced—such as by arcing of the contacts, or through dirty contacts—is quite noticeable in the output. To avoid this, it has been proposed heretofore (see Harold O. Schwartz et al. application Ser. No. 455,233, filed May 12, 1965, for Electronic Musical Instrument Diode Keying) to switch only biasing potentials, and to utilize diodes to block or carry the signal according to the potential applied thereto.

In accordance with the present invention, one object thereof is to extend the system of diode switching as noted just above, whereby diodes poled oppositely of the generator switching diodes are used in conjunction with key switches to effect switching of the generator switching diodes while maintaining isolation among the various key switches.

It is another object of the present invention to provide an electronic organ wherein switches corresponding to keys an octave apart are connected through respective diodes to a common point, and from said common point connection is made to generator diode switches for switching on the diodes in response to operation of any of the octavely related keys.

It is yet another object of the present invention to provide an improved sustain connected to diode switching circuits of an electronic organ in part through additional diodes.

Other and further objects and advantages of the present invention will be apparent from the following description when taken in connection with the accompanying drawings wherein.

Figure 1:
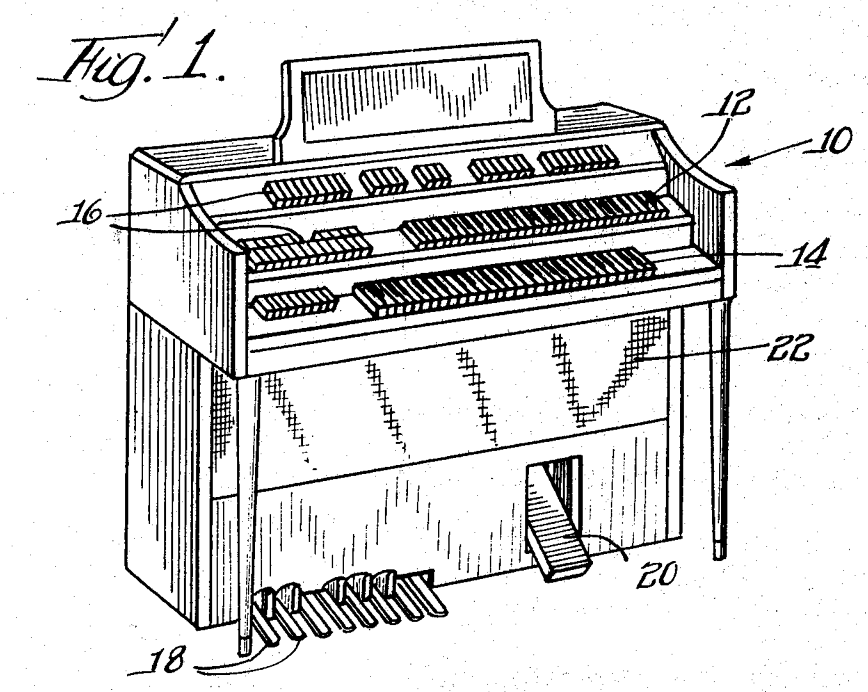
FIG. 1 is a perspective view of an organ constructed in accordance with the present invention.

Turning now in greater particularity to the drawings, and first to FIG. 1, there will be seen an organ 10 constructed in accordance with the principles of the present invention. The organ may be of the spinet type, having shortened, overlapping manuals or keyboards, and only one octave plus one of pedals, or it may have longer keyboards and a full 32-note pedalboard. In any event, the organ includes an upper or swell manual or keyboard 12, and a lower or great manual or keyboard 14, as well as a plurality of stop tablets 16. The organ further includes a pedal manual or clavier 18 and a swell pedal 20 for controlling the overall volume of the organ. A suitable loudspeaker system 22 is disposed behind grille cloth at the front of the organ, and this may include one or more loudspeakers.

Figure 2:
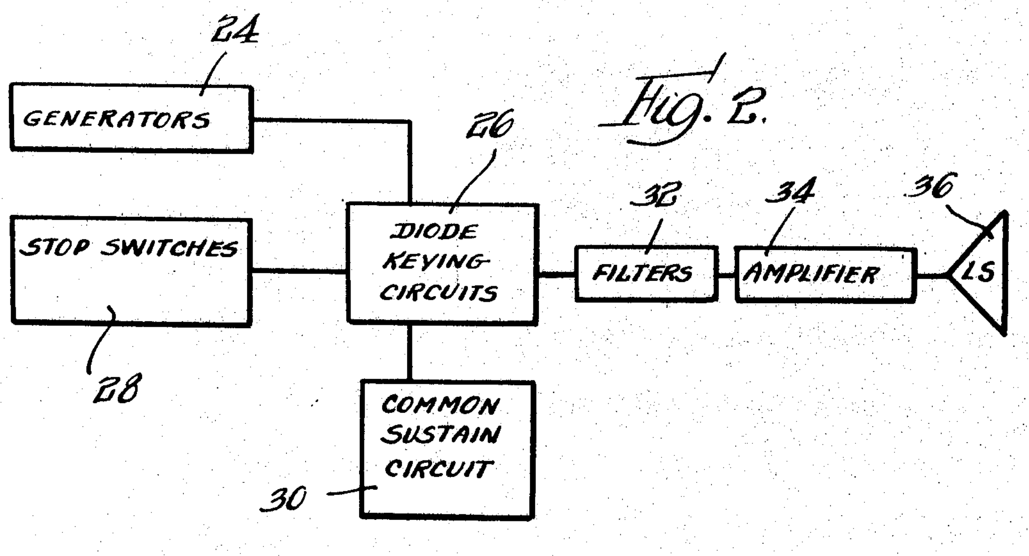
FIG. 2 is a block diagram of the switching system of the organ according to the present invention.

The switching of the organ will be understood generally from FIG. 2, wherein the generators are indicated collectively at 24. The generators may be of any suitable type known and used for electronic organs, but at the present stage of technology, such generators preferably are transistor oscillators. The organ in question is of the subtractive or format type as opposed to the additive or synthesing organ. The generators are connected to diode keying circuits 26, the latter including diodes respectively connected to the generators and normally non-conductive, but rendered conductive by closure of key switches forming a part of the diode keying circuits. For example, the signal is preferably a square wave always above ground potential so as not to be conducted by the reversely poled diodes. Stop switches 28 are connected to the diode keying circuits, as in a common sustain circuit 30. The output of the diode keying circuits 26 is connected to appropriate filters 32, the latter being connected to an amplifier 34. The amplifier may contain one or more stages of preamplification, plus an output power amplifier, and the output of the amplifier is connected to the loudspeaker system 36 which, as mentioned heretofore, may comprise one or more loudspeakers.

Figure 3:
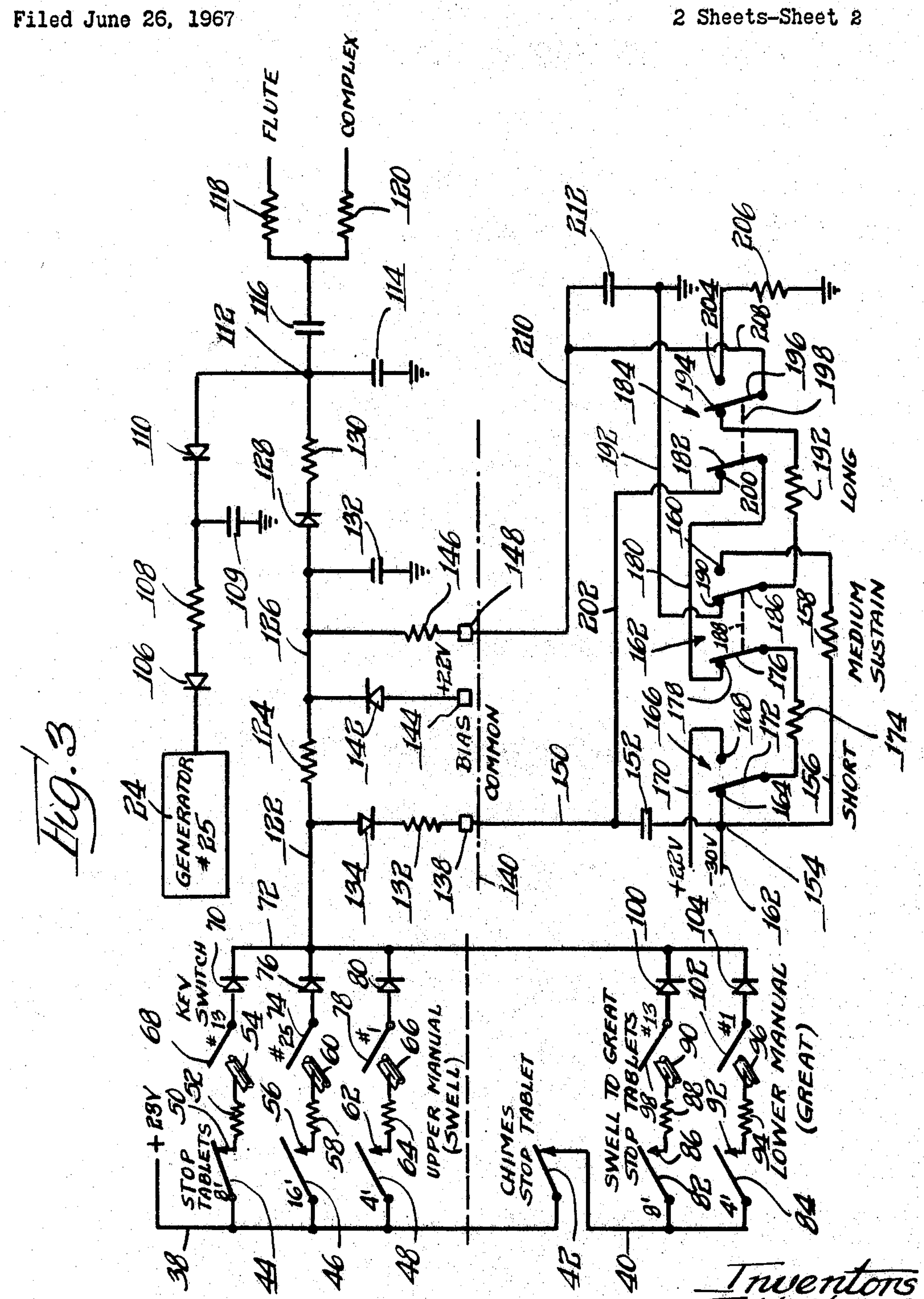
FIG. 3 is a partial schematic wiring diagram of an organ constructed in accordance with the present invention.

Turning now to FIG. 3, there will be seen along the left side thereof a positive voltage supply line or bus 38, which in the illustrative example is plus 23 volts. The bus 38 is in the upper or swell manual, and is connected to a lower or great manual bus 40 by means of a stop tablet operated switch 42. Three stop tablet operated switches 44, 46, and 48 are connected to the bus 38, and these stop tablets respectively comprise 8-foot, 16-foot, and 4-foot stop tablets. The switch 44 has a fixed contact 50 leading through a resistor 52 to a conductive stop rod 54. The switch 44 is shown as normally closed on the fixed contact 50. Similarly, the switch 46 has a fixed contact 56 connected through a resistor 58 to a conductive stop rod 60, and the switch 48 has a fixed contact 62 connected through a resistor 64 to a conductive stop rod 66.

Insofar as the present invention is concerned, each key of the upper manual 12 has three movable contacts, each engageable with one of the conductive stop rods 54, 60, and 66, and insulated from one another. One such movable switch contact 68 is shown as engageable with the stop rod 54, and by way of specific example, this is associated with key #13. The key switch 68 is connected through a diode 70 to a collector line or bus 72. Specifically, the switch 68 is connected to the anode or the diode, with the cathode connected to the collector 72. Similarly, the movable switch contact 74, which is shown as being engageable with the bus rod 60, is connected to the anode of a diode 76, the cathode thereof being connected to the collector 72. In the specific example, the switch contact 74 is associated with key #25. Similarly, switch contact 78 associated with key #1 is connected to the anode of a diode 80, the cathode thereof being connected to the collector 72.

As to the lower or great manual, two stop tablet switches 82 and 84 are shown. The stop tablet switch 82 is engageable with a fixed contact 86 leading through a resistor 88 to a conductive stop rod 90, while the switch contact 84 is engageable with a fixed contact 92 leading through a resistor 94 to a conductive stop rod 96. There are two movable switch contacts associated with each key in the lower manual, and in the drawing a movable contact 98 is shown as engageable with stop rod 90 and is operable by key #13 of the lower manual. The contact 98 is connected to the anode of the diode 100, the cathode thereof being connected to the collector 72. A movable contact 102, operable by key #1 of the lower manual, is connected to the anode of a diode 104, the cathode thereof being connected to the collector 72.

One of the generators 24 is shown, and specifically this is generator #25. The generator is connected to the cathode of a diode 106, and the diode is connected to a resistor 108. The resistor 108 is connected to a capacitor 109 shunted to D.C. ground, and to the cathode of another diode 110, the anode of this diode being connected to a common connection point 112 which is, in effect, an output point. The junction or output point 112 is shunted to the signal ground by a capacitor 114, and is connected through a coupling capacitor 116 to a resistor 118 leading to flute filters, and through a resistor 120 leading to the complex filters, and through a resistor 120 leading to the complex filters of the filter 32.

A connecting line 122 is connected to the collector 72 and leads to a resistor 124. The resistor is connected to a line 126 which is connected to the anode of a diode 128, the cathode thereof being connected through a resistor 130 to the junction or output point 112. The line 126 is shunted to D.C. ground by a capacitor 132.

The line 122 is connected to the anode of a diode 134, the cathode of which is connected through a resistor 136 to a common connecting point 138. A broken line 140 is indicated on the drawing immediately below the connecting point 138, and all parts below that are in common; i.e., there is only one of each of the parts below the line. The circuit immediately overlying the line is duplicated for each note, and in the specific example there is a total of 72 such circuits.

The line 126 is connected to the anode of a diode 142, the cathode of which is connected to a common biasing point 144, which in the specific example is at 2.2 volts. In addition, the line 126 is connected through a resistor 146 to a common connection point 148.

Connection is made from the common connecting point 138 to a line 150 leading to a capacitor 152. The capacitor is connected to a junction point 154 and from there through a line 156 to a resistor 158. The resistor is connected to the right fixed contact 160 of a switch 162 comprising a medium sustain switch. The junction point 154 also is connected through a line 162 to a source of negative direct potential indicated as −30 volts. The junction further is connected to a left fixed contact 164 of a switch 166 comprising a short sustain switch.

The short sustain switch 166 includes an additional fixed contact 168 which leads through a wire 170 to a source of positive potential, indicated as +2.2 volts. The switch 166 further includes a movable contact 172 controlled by one of the stop tablets 16 and movable alternatively into engagement with the fixed contacts 164 and 168. The movable contact leads through a resistor 174 to a first movable contact 176 of the medium sustain switch 162. The movable contact 176, in its leftmost position as shown in the drawing, is engageable with a fixed contact 178, and is movable to the right to an open position. The fixed contact leads through a wire 180 to a movable contact 182 of a long sustain switch 184.

The medium sustain switch 162 includes a second movable contact 186 which is ganged at 188 for operation with the movable contact 176. In the leftmost position shown, the movable contact 186 engages a fixed contact 190, and this fixed contact is grounded through a wire 192. The second fixed contact 160, which is alternatively engageable by the movable contact 186, has already been mentioned.

The movable contact 186 is connected through a resistor 192 to a fixed contact 194 engageable by a second movable contact 196 of the switch 184, the movable contact 196 being ganged at 198 with the movable contact 182 for simultaneous movement therewith.

The movable contact 182 in the leftmost position shown is engageable with a fixed contact 200 which is connected by a wire or line 202 to the wire or line 150. In the rightmost position the movable switch contact 182 does not engage anything, but is open-circuited. In the rightmost position of the switch contact 196, it engages a fixed contact 204 which is grounded through a resistor 206.

The movable contact 196 is connected by a wire or line 208 to a wire or line 210 leading to the common junction point 148. The wire or line 210 also is grounded through a capacitor 212.

OPERATION

By way of example, the 8-foot stop tablet switch 44 is shown as closed on its corresponding fixed contact 50. Thus, potential is applied to the entire stop rod 54. Closure of any key switch 68 against this stop rod will cause the positive potential to be passed by the corersponding diode to the collector 72. For example, if the switch 68 corresponding to key #13 (the switch shown in the drawing) is depressed, the potential will be transmitted to collector 72. At the same time the two additional switch contacts of key #13 corresponding to switch contacts 74 and 78 will be closed against their stop rods 60 and 66. However, since these stop rods are not energized, the respective stop switches 46 and 48 being open, no potential will be transmitted to the corresponding collector 72. However, it should be borne in mind that there are additional switch contacts other than those shown which are used for other voices or effects in the organ. Thus, it might be desirable to depress key #25 to play another voice at the same time that key #13 is depressed. Since potential is on the collector 72 from the key switch 68 shown, were it not for the diode 76, there would be potential applied from the collector 72 to the bus bar 60 to play undesired notes. Hence, the diodes 70, etc., provided isolation.

The positive potential applied to the collector 72 is passed by the resistor 124 and the diode 128 to open or render conductive the diodes 106 and 110, whereby the output from generator #25 is passed to the output point 112, and hence on to the flute and complex filters.

The positive potential on the line 126 charges the capacitor 132, which preferably is on the order of 2 microfarads. With the three sustain switches in the positions shown, sustain is off. Hence, upon cessation of depression of any key switch, the capacitor 132 rapidly discharges through the resistor 124, diode 134, and resistor 136 to the sustain circuit, and specifically through the lines 150 and 202, switch contacts 200 and 182, line 180, switch contacts 178 and 176, and resistor 174 to switch contact 172 and 164, and to −30 volts. The resistors in question are all of rather low value, resistor 136 being 33,000 ohms and resistor 174 being 220 ohms. Hence, a −20 volts apears at the common point 138, whereby it will be seen that the capacitor 132 discharges practically instantaneously.

With the short sustain switch contact 172 moved to the right, the connection is to +2.2 volts, rather than to −30 volts, and +1.5 volts appears at the common point 138, whereby the capacitor 132 discharges fairly rapidly, but not as fast as previously described.

When the medium sustain switch is pushed to the right, the voltages just mentioned are removed from the circuit, due to opening of the switch contacts 176 and 178. In this case, the capacitor 132 discharges through the resistor 146, which is of rather high value, for example 1.5 megohms, through the line 210 and line 208, switch contacts 196 and 194, resistor 192, switch contacts 186 and 160, and resistor 158 and line 156 to the negative 30 volts. As a result, −16 volts appears at the common junction point 148. However, since the resistor 146 is a rather large one, the discharge of the capacitor 132 is at an intermediate rate, leading to a medium sustain.

When the long sustain switch 184 is moved to the active position, i.e. to the right, the negative voltage source is switched out, and connection is made through the switch contact 196 and 202 to the resistor 206, and hence to ground. Thus, a negative potential does not appear at the common junction point 148, but rather, connection is through a 2200 ohm resistor to ground (note that resistor 192 is also 2200 ohms). Thus, with the capacitor 132 now discharging to ground rather than to a negative potential, the discharge time is longer.

As will be understood, as long as there is a positive potential on the capacitor 102, it will act through the diode 128 to hold the diodes 106 and 110 open, albeit to a lesser degree, whereby to produce the desired decay characteristics. On the other hand, when no notes are being played, the positive potential of 2.2 volts from the bias common point 144 through the diode 142 back-biases the diodes 70, 76, etc. positively to lock these diodes in nonconducting condition. Further, this 2.2 volt potential is applied through diode 128 and resistor 130 to junction 112, raising the potential of this junction to about +1.5 volts, nearly the threshhold of opening diodes 110 and 106, whereby to minimize key plop or click when these diodes are switched on.

The switch 42 is normally closed, whereby the lower or great manual can be played at the same time as the upper or swell manual. However, certain of the keys of the lower manual are capable of playing a chimes accompaniment. When the chimes accompaniment is turned on, the switch 42 is opened, whereby the lower manual will be disconnected from the positive voltage source, whereby to render it incapable of playing the notes in the manner heretofore described.

The specific example of the invention as herein shown and described will be understood as being for illustrative purposes only. Various changes in structure will no doubt occur to those skilled in the art, and will be understood as forming a part of the present invention insofar as they fall within the spirit and scope of the appended claims.

The invention is claimed as follows:

1. In an electric organ comprising a keyboard having a plurality of playing keys, a plurality of key switch means corresponding to said keys, and each having a plurality of switch contacts closed by depression of a respective key, a plurality of tone generators corresponding to the notes of said organ, and an output system, a keying system comprising a potential bus of predetermined polarity, a plurality of stop rods positioned for engagement by said switch contacts in closed position, a plurality of stop switches respectively connecting said stop rods to said potential bus, a group of said switch contacts corresponding to one of said generators and each thereof corresponding to a different one of said keys, a plurality of common collectors each corresponding to one of said generators, a plurality of diodes respectively connecting said group of switch contacts to said collector and each polarized to conduct current only from said potential bus to said collector, an output junction for each of said generators, said output junctions being connected to said output system and respectively connected to said collectors, diode means connecting each generator to its ouput junction and polarized and biased so as to preclude conduction of a generator signal to the corresponding output junction, closure of one of said group of key switch contacts on a stop rod connected to said potential bus by its stop switch biasing said diode means for conduction to pass the generator signal, a potential source of the same polarity as said bus but of lower magnitude, and means including a diode connecting said potential source to said output junction and to said collector partially to forward-bias said diode means and to back-bias said plurality of diodes.

2. The combination set forth in claim 1, and further including a second diode connecting the first mentioned diode to said output junction.

3. In an electric organ comprising a keyboard having a plurality of playing keys, a plurality of key switch means corresponding to said keys, a plurality of tone generators corresponding to the notes of said organ, and an output system, a keying system comprising a source of potential of predetermined polarity, means connecting said potential source to said switch means, a plurality of connection means each corresponding to one of said generators, a plurality of isolating diodes respectively connected in series with said key switch means, a number of switch means and isolating diodes being connected to one connection means for the playing of notes in predetermined musical relation, a plurality of output junctions each corresponding to one of said generators, said output junctions being connected to said output system, and a diode connected to each such junction and to the corresponding connection means and polarized to conduct from said connection means to said junction, and diode means connecting each generator to its output junction and polarized and biased so as to preclude conduction of a generator signal to the corresponding output junction, closure of an appropriate switch means thereupon biasing said diode means for conduction to pass the generator signal.

4. The combination set forth in claim 3, and further including a potential source of the same polarity as said bus but of lower magnitude, and means including a diode connecting said potential source to said output junction and to said collector partially to forward-bias said diode means and to back-bias said plurality of diodes.

5. The combination set forth in claim 4, and further including a second diode connecting the first mentioned diode to said output junction.

References Cited

UNITED STATES PATENTS

| | | | |
|---|---|---|---|
| 3,291,886 | 12/1966 | Tinker | 84—1.26 X |
| 3,333,041 | 7/1967 | Munch et al. | 84—1.26 X |
| 3,389,211 | 6/1968 | Slaats | 84—1.13 X |
| 3,402,251 | 9/1968 | Bright | 84—1.01 X |
| 3,408,449 | 10/1968 | Tinker | 84—1.26 X |

HERMAN KARL SAALBACH, Primary Examiner

S. CHATMON, Jr., Assistant Examiner

U.S. Cl. X.R.

84—1.13, 1.26